United States Patent
Fujinami et al.

(10) Patent No.: US 8,236,388 B2
(45) Date of Patent: Aug. 7, 2012

(54) METHOD OF PRODUCING GAS BARRIER FILM

(75) Inventors: Tatsuya Fujinami, Odawara (JP); Toshiya Takahashi, Odawara (JP)

(73) Assignee: FUJIFILM Corporation, Tokyo (JP)

( * ) Notice: Subject to any disclaimer, the term of this patent is extended or adjusted under 35 U.S.C. 154(b) by 386 days.

(21) Appl. No.: 12/553,476

(22) Filed: Sep. 3, 2009

(65) Prior Publication Data

US 2010/0062183 A1 Mar. 11, 2010

(30) Foreign Application Priority Data

Sep. 8, 2008 (JP) ................................. 2008-229581

(51) Int. Cl.
*H05H 1/24* (2006.01)
(52) U.S. Cl. .................... 427/574; 427/578; 427/579
(58) Field of Classification Search .................. 427/574, 427/578, 579
See application file for complete search history.

(56) References Cited

U.S. PATENT DOCUMENTS

| | | | | |
|---|---|---|---|---|
| 4,363,828 | A * | 12/1982 | Brodsky et al. | 438/485 |
| 4,767,516 | A | 8/1988 | Nakatsuka et al. | |
| 5,124,014 | A * | 6/1992 | Foo et al. | 438/694 |
| 6,857,387 | B1 * | 2/2005 | Sun et al. | 118/723 E |
| 2008/0197101 | A1 * | 8/2008 | Rapoport | 215/252 |
| 2008/0211066 | A1 * | 9/2008 | Akedo et al. | 257/640 |
| 2009/0197101 | A1 * | 8/2009 | Nakagame et al. | 428/447 |
| 2011/0195203 | A1 * | 8/2011 | Fujinami | 427/577 |
| 2011/0223358 | A1 * | 9/2011 | Fujinami | 427/579 |

FOREIGN PATENT DOCUMENTS

| | | |
|---|---|---|
| JP | 62-67729 A | 3/1987 |
| JP | 08-339992 A | 12/1996 |
| JP | 2004-160636 A | 6/2004 |
| JP | 2005-310834 A | 11/2005 |
| JP | 2005-342975 A | 12/2005 |
| JP | 2007-012738 A | 1/2007 |

OTHER PUBLICATIONS

Moravej, Maryam, et al., "Atmospheric Plasma Deposition of Coatings Using a Capacitive Discharge Source". Chemical Vapor Deposition, 2005, 11, pp. 469-476.*
Fujita, Shizuo, et al., Electrical properties of silicon nitride films plasma-deposited from $SiF_4$, $N_2$, and $H_2$ source gases. J. Apply, Phys. 57 (2), Jan. 15, 1985. pp. 426-431.*
Alexandov, S.E., et al., "A study of remote plasma enhanced CVD of silicon nitride films". Journal de physique IV, Colloque C3, supplement au Journal de Physique II, vol. 3, aout 1993, p. 233-240.*

(Continued)

*Primary Examiner* — Bret Chen
(74) *Attorney, Agent, or Firm* — Sughrue Mion, PLLC

(57) ABSTRACT

A method of producing a gas barrier film comprises the steps of: supplying a material gas including silane gas, ammonia gas and at least one of nitrogen gas and hydrogen gas to a process chamber; keeping the process chamber at an internal pressure of 20 to 200 Pa; holding a substrate in the process chamber at a substrate temperature of not more than 70° C.; forming a bias potential of −100 V or less at the substrate; and supplying power P (W) to the material gas so as to have a ratio P/Q of the power P to a silane gas flow rate Q (sccm) of 15 to 30 W/sccm to generate plasma, thereby depositing a silicon nitride layer on a surface of the substrate.

6 Claims, 1 Drawing Sheet

OTHER PUBLICATIONS

Doughty, C., et al., "Silicon nitride films deposited at substrate temperatures <100oC in a permanent magnet electron cyclotron resonance plasma". J. Vac. Sci. Technol. A 17(5), Sep./Oct. 1999, pp. 2612-2618.*

Japanese Office Action issued Jun. 5, 2012 in corresponding Japanese Patent Application No. 2008-229581, 8 pages in Japanese and English.

* cited by examiner

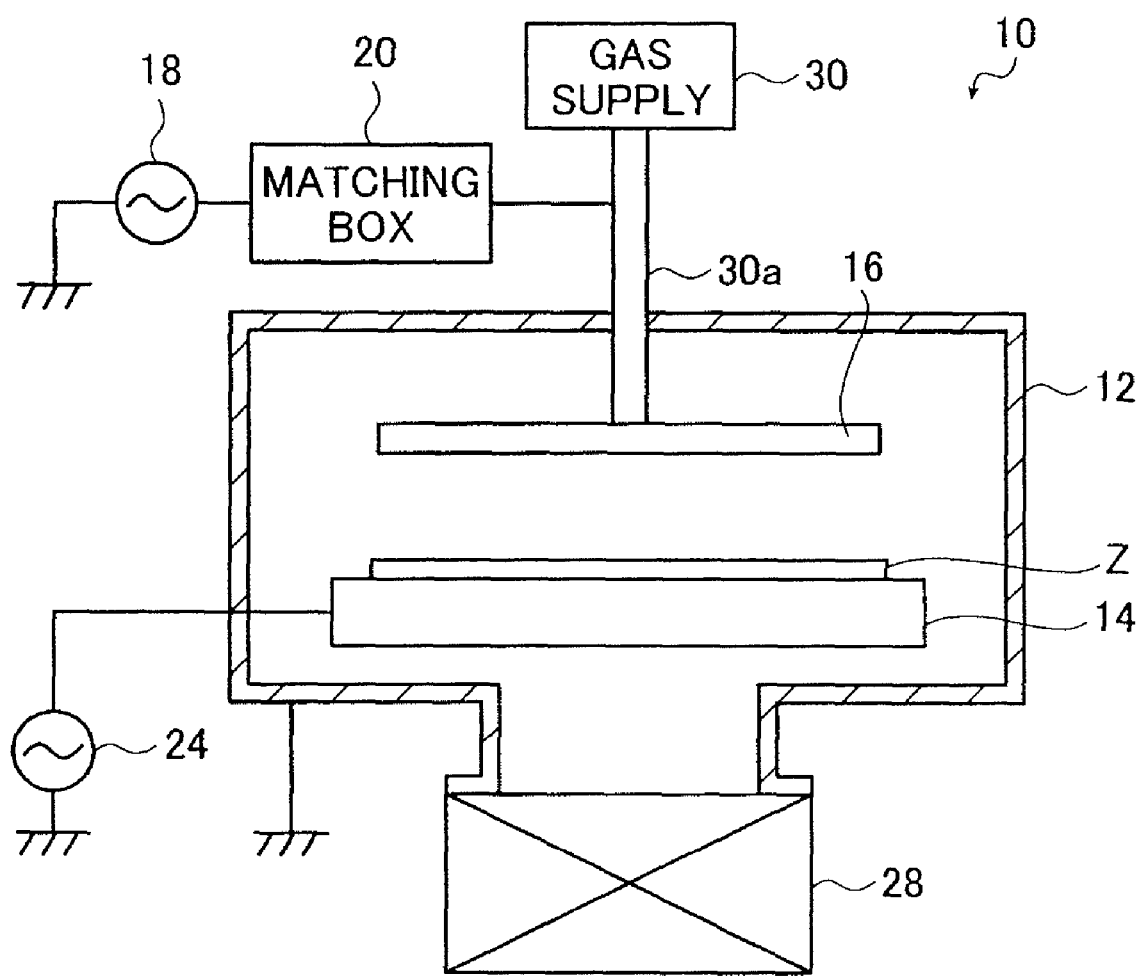

METHOD OF PRODUCING GAS BARRIER FILM

This application claims priority to Japanese Patent Application No. 2008-229581, filed Sep. 8, 2008, the disclosure of which is incorporated herein by reference in its entirety. In addition, the entire contents of all patents and references cited in this specification are also incorporated herein by reference.

BACKGROUND OF THE INVENTION

The present invention relates to a method of producing a gas barrier film making use of capacitively coupled plasma-enhanced chemical vapor deposition, and more specifically relates to a gas barrier film production method capable of producing a gas barrier film having good gas barrier properties using a less heat-resistant substrate.

Gas barrier films having a silicon nitride layer deposited on the surface of a resin (plastic) film are known as gas (water vapor) barrier films employed in various apparatuses and optical devices which are required to be moisture-proof.

Capacitively coupled plasma-enhanced chemical vapor deposition (hereinafter abbreviated as "CCP-CVD") is a known process for depositing a silicon nitride layer.

As is well known, CCP-CVD is a technique in which a material gas is supplied between a pair of electrodes used, and a voltage is applied to generate plasma, which causes the material gas to dissociate and ionize to generate radicals and ions, thus performing film deposition on the surface of an object disposed between the electrodes for treatment.

CCP-CVD is advantageous in that, by supplying the material gas through the electrodes, the material gas can be uniformly supplied to the whole film-forming area (gas is easily made uniform) even in the case where the electrodes have an increased surface area, and hence this technique can be easily applied to a substrate having a large surface area.

For example, JP 2005-342975 A discloses a transparent gas barrier film which has a silicon nitride layer having an N/Si elemental ratio of 0.8 to 1.4 and a film density of 2.1 to 3 g/cm$^2$.

In Examples of JP 2005-342975 A, a silicon nitride layer is formed by CCP-CVD on a polyethersulfone film as a substrate using a material gas including silane gas, ammonia gas and hydrogen gas under the conditions of a substrate temperature of 150° C., a silane gas flow rate of 2 to 20 sccm, a power applied of 300 W, and a film deposition pressure of 10 Pa, thus producing a gas barrier film.

As described in JP 2005-342975 A, a resin film is used for the substrate of a gas barrier film.

JP 2005-342975 A uses a polyethersulfone film for the substrate and deposits a silicon nitrate layer at a substrate temperature of 150° C., but it is difficult to deposit a silicon nitride layer on a less heat-resistant resin film such as an inexpensive polyethylene terephthalate (PET) film at the substrate temperature of 150° C.

Film deposition at a lower temperature enables a silicon nitride layer to be deposited on a less heat-resistant resin film such as a PET film. However, gas barrier films obtained by film deposition at such a low temperature very often have no desired performance.

In addition, a film deposition pressure of 10 Pa requires a sophisticated film deposition device, and particularly in cases where improvement of the productivity, that is, improvement of the flow rate of a material gas is desired, involves a considerable increase in device cost.

SUMMARY OF THE INVENTION

An object of the present invention is to solve the above-mentioned problems of the prior art by providing a gas barrier film production method that is capable of using a less heat-resistant resin film such as a PET film for the substrate and producing in an inexpensive device, with high productivity, high-quality gas barrier films which exhibit excellent gas barrier properties over a long period of time.

A method of producing a gas barrier film according to the present invention comprises the steps of: supplying a material gas including silane gas, ammonia gas and at least one of nitrogen gas and hydrogen gas to a process chamber; keeping the process chamber at an internal pressure of 20 to 200 Pa; holding a substrate in the process chamber at a substrate temperature of not more than 70° C.; forming a bias potential of −100 V or less at the substrate; and supplying power P (W) to the material gas so as to have a ratio P/Q of the power P to a silane gas flow rate Q (sccm) of 15 to 30 W/sccm to generate plasma, thereby depositing a silicon nitride layer on a surface of the substrate.

BRIEF DESCRIPTION OF THE DRAWINGS

The FIGURE is a cross-sectional view schematically showing a plasma CVD device used to implement the gas barrier film production method in an embodiment of the invention.

DETAILED DESCRIPTION OF THE INVENTION

On the following pages, the method of producing a gas barrier film according to the present invention is described in detail with reference to the accompanying drawing.

The FIGURE shows the configuration of a plasma CVD device used to implement the gas barrier film production method of the invention.

A plasma CVD device 10 shown in the FIGURE is a device with which a silicon nitride film serving as a gas barrier layer is deposited or formed on the surface of a substrate Z by capacitively coupled plasma-enhanced chemical vapor deposition (CCP-CVD) to produce a gas barrier film.

This CVD device 10 is a common-type film deposition device with which film deposition on the surface of the substrate Z is carried out by CCP-CVD, and basically includes a vacuum chamber 12, a substrate holder 14, a shower head electrode 16, an RF power source 18, a matching box 20, a bias power source 24, a vacuum evacuation means 28 and a gas supply means 30.

As shown in the FIGURE, the substrate holder 14 and the shower head electrode 16 are disposed within the vacuum chamber 12.

In the present invention, the substrate Z is not particularly limited as long as a silicon nitride layer can be deposited by CCP-CVD using a material gas including silane gas, ammonia gas, hydrogen gas and/or nitrogen gas.

From the viewpoint that the effects of the invention can be exhibited more advantageously, various films having low heat resistance are preferably used for the substrate Z, and examples thereof that may be suitably used include resin films (plastic films) having a glass transition temperature of not more than 70° C. such as polyethylene terephthalate (PET) films.

In the present invention, the substrate Z may be such that it has any of the various films, on the surface (on at least the film deposition surface) of which are formed layers (films) that are made of organic materials or inorganic materials to provide various functions (e.g., a protective layer, an adhesive layer, a light reflecting layer, a light shield layer, a planarizing layer, a buffer layer, and a stress relaxing layer).

The vacuum chamber (process chamber) 12 is a known vacuum chamber employed in various vacuum film-forming devices such as plasma CVD devices, sputtering devices, and vacuum deposition devices.

Exemplary means that may be used for the vacuum evacuation means 28 include vacuum pumps such as a turbo pump, a mechanical booster pump and a rotary pump, an assist means such as a cryogenic coil, and various other (vacuum) evacuation means which use a means for adjusting the ultimate degree of vacuum or the amount of discharge air.

The substrate holder 14 is used to hold the substrate Z at a predetermined film deposition position and various substrate holders that may be used in various vacuum film-forming devices are available.

Although not shown, the substrate holder 14 of the CVD device 10 has a temperature adjusting means incorporated therein to keep the temperature of the substrate Z at 70° C. or less during deposition of a silicon nitride layer.

The temperature adjusting means is not particularly limited as long as the temperature of the substrate Z can be kept at 70° C. or less during film deposition, and known devices may be used, as exemplified by a temperature adjusting means in which a temperature adjusting liquid is flowed within the substrate holder 14 (through a predetermined channel within the substrate holder 14) and a cooling means using a piezoelectric element.

In the illustrated case, the substrate holder 14 also serves as one electrode of the electrode pair during film deposition by means of CCP-CVD and is connected to the bias power source 24. In other words, the substrate holder 14 in the illustrated case also serves as a counter electrode for the shower head electrode 16 to which the main power for plasma generation is supplied.

The bias power source 24 is an RF power source for applying a voltage of −100 V or less to the substrate holder 14 (for supplying power depending on the film deposition pressure or the like so that the substrate holder 14 may have a potential of −100 V or less). A bias potential of −100 V or less is formed at the substrate Z by applying a voltage of −100 V or less from the bias power source 24 to the substrate holder 14. The bias power source 24 is preferably of such a configuration that the RF potential at a frequency of 100 kHz or more is formed at the substrate Z.

The present invention may be of another configuration that the substrate holder only has the effect of holding the substrate and an electrode for forming a bias potential of −100 V or less at the substrate Z (electrode for forming an electrode pair for CCP-CVD) is separately provided.

In the present invention, the power source for forming the bias potential at the substrate Z is not limited to the illustrated RF power source, and various power sources employed in forming the bias potential at the substrate Z as exemplified by a DC pulsed power source may be used in CCP-CVD. In other words, in the present invention, the bias potential formed at the substrate Z may be an RF potential or a pulsed potential as long as it is −100 V or less. Even in cases where a DC pulsed power source is used, a pulsed potential at 100 kHz or more is preferably formed at the substrate Z as the bias potential.

In cases where an RF power source as in the illustrated embodiment is used for the bias power source 24, the bias potential may be applied to the substrate holder 14 via a matching box (not shown) for impedance matching of the power from the RF power source when needed.

The shower head electrode 16 has, for example, a hollow rectangular box shape and is disposed so that its largest surface faces the substrate holder 14 holding the substrate Z.

The shower head electrode 16 is an electrode to which the main power for plasma generation is supplied, and is combined with the substrate holder 14 to form an electrode pair for carrying out CCP-CVD. The shower head electrode 16 is connected to the RF power source 18 to be described later via the matching box 20 by means of a conductor wire (not shown) penetrated through a pipe 30a for supplying a material gas.

The shower head electrode 16 is suspended from the ceiling plane in the vacuum chamber 12 and supported at a predetermined position by means of the supply pipe 30a or a support means (not shown).

A large number of through holes are formed over the whole surface of the shower head electrode 16 facing the substrate holder 14. In addition, a material gas is supplied to the interior of the shower head electrode 16 which is connected to the gas supply means 30 by the supply pipe 30a.

In other words, the shower head electrode 16 doubles as electrode and material gas supply means. The material gas supplied from the gas supply means 30 to the interior of the shower head electrode 16 is then supplied through the through holes formed at the surface facing the substrate holder 14 to the space between the substrate holder 14 and the shower head electrode 16.

The gas supply means 30 is a known gas supply means employed in plasma CVD devices and sputtering devices.

In the present invention, the gas supply means 30 supplies to the shower head electrode 16 silane gas, ammonia gas, and at least one of hydrogen gas and nitrogen gas. In addition to these gases, the gas supply means 30 may optionally supply inert gases such as argon gas to the shower head electrode 16 as an auxiliary gas.

The present invention is not limited to the configuration in which the shower head electrode is used for the material gas supply means. For example, various gas supply means employed in plasma CVD devices may be used, as exemplified by a means in which the electrode to which the main power for plasma generation is supplied only serves as an electrode, and a nozzle or a shower head for supplying a gas is separately provided between the electrode and the substrate holder 14.

As described above, the shower head electrode 16 is connected to the RF power source 18 via the matching box 20.

The RF power source 18 is a power source for supplying to the shower head electrode 16 the main power for plasma generation in CCP-CVD, and various known RF power sources employed in plasma CVD devices may be used.

The matching box 20 is a known box for impedance matching of the power from the RF power source 18.

The present invention uses the material gas including silane gas ($SiH_4$), ammonia gas ($NH_3$) and at least one of hydrogen gas ($H_2$) and nitrogen gas ($N_2$). A silicon nitride layer is deposited on the surface of the substrate Z through CCP-CVD by setting the ratio P/Q (W/sccm) of the main power P (W) applied for plasma generation to the silane gas flow rate Q (sccm) at 15 to 30 W/sccm, and the film deposition pressure at 20 to 200 Pa, maintaining the substrate at a temperature of not more than 70° C., and applying a bias potential of −100 V or less from the bias power source 24 to the substrate holder 14.

The inventors of the present invention have made intensive studies for the purpose of producing high-quality gas barrier films by depositing a silicon nitride layer on a substrate such as a less heat-resistant resin film (e.g., inexpensive PET film) by means of CCP-CVD having the following advantages: the structure is simple; and the electrode can easily have a larger surface area, that is, there is high compatibility with a large-sized substrate (a wide substrate in the case of a roll to roll device to be described later).

As also described in JP 2005-342975 A, the substrate is often heated for the purpose of improving the film quality during film deposition by means of CCP-CVD. However, in cases where a less heat-resistant substrate such as a PET film is used, the substrate Z cannot be heated to a temperature as high as 100° C. or more, for example, and it is necessary to carry out film deposition while keeping the substrate at a low temperature.

According to the studies made by the inventors of the invention, the gas barrier properties drastically deteriorate over time when a gas barrier film is produced by depositing a silicon nitride layer through CCP-CVD with the substrate kept at a low temperature, using a material gas including silane gas, ammonia gas, hydrogen gas and/or nitrogen gas. Even in cases where heat is applied to the gas barrier film formed for some reasons, the gas barrier properties drastically deteriorate.

What is more, according to the studies made by the inventors of the invention, impurities such as hydrogen are incorporated in the silicon nitride layer during deposition of the silicon nitride layer using the material gas with the substrate kept at a lower temperature and remain following film deposition, causing silicon nitride to oxidize or otherwise react over time to convert to other compound. This conversion drastically deteriorates the gas barrier properties.

The inventors of the invention further made intensive studies to solve the foregoing problems and found that such reduction of the gas barrier properties of the silicon nitride layer can be minimized by increasing the main power applied for plasma generation in CCP-CVD, in other words, the power applied to the shower head electrode 16 in the CVD device 10 shown in the FIGURE. More specifically, it has been found that the reduction of the gas barrier properties of the silicon nitride layer can be minimized in a consistent and favorable manner by setting the ratio P/Q of the main power P applied for plasma generation to the silane gas flow rate Q at 15 to 30 W/sccm.

However, at an increased power for plasma generation, a strong vapor phase reaction takes place in the film deposition space and causes a large amount of particles to be generated and incorporated in the silicon nitride layer. Incorporation of the particles into the silicon nitride layer considerably deteriorates the gas barrier properties, making it impossible to produce a gas barrier film having desired performance.

The particles produced from the material gas under the above-described film deposition conditions are generally negatively charged. The present invention employs this phenomenon to deposit the silicon nitride layer with a bias potential of −100V or less formed at the substrate Z. This causes the particles to repel the substrate Z under the action of electric charge to prevent incorporation of the particles into the silicon nitride layer during film deposition.

Accordingly, the present invention uses the substrate Z having low heat resistance such as a PET film to deposit the silicon nitride layer on the substrate Z under the above-described conditions, which enables the reduction of the gas barrier properties due to incorporation of the particles into the silicon nitride layer and deterioration of the gas barrier properties over time to be considerably minimized. High-quality gas barrier films exhibiting excellent gas barrier properties over a long period of time can be consistently produced with high production efficiency using an inexpensive device.

In the present invention, the ratio P/Q (W/sccm) of the main power P (W) supplied to the electrode for plasma generation to the silane gas flow rate Q (sccm) is 15 to 30 W/sccm.

At a P/Q of less than 15 W/sccm, the power is not sufficiently supplied and the gas barrier film produced has drastically decreased gas barrier properties due to deterioration over time. Conversely, at a P/Q exceeding 30 W/sccm, the gas barrier film has no problem of deterioration over time, but a large amount of particles are formed, which cannot be prevented by application of a bias potential to the electrode. The gas barrier properties and film quality will be thus deteriorated due to incorporation of the particles into the silicon nitride layer.

The flow rates of silane gas and ammonia gas are not particularly limited and may be determined as appropriate for the required film deposition rate and film deposition area so that the above-described condition is met.

Hydrogen gas and nitrogen gas mainly serve as dilution gases. Use may be made of hydrogen gas or nitrogen gas, or both.

Use of hydrogen gas is advantageous in that incorporation of hydrogen into the silicon nitride layer can be suppressed. Use of nitrogen gas is advantageous in terms of film deposition rate, because it also serves as a nitrogen source of the silicon nitride layer.

The flow rates of hydrogen gas and nitrogen gas are also not particularly limited and may be determined as appropriate for the required film deposition rate. Hydrogen gas and nitrogen gas are preferably used at flow rates 5 to 10 times the flow rate of silane gas. In cases where hydrogen gas and nitrogen gas are used in combination, the total flow rate of both the gases is preferably 5 to 10 times the flow rate of silane gas.

The intensity of the main power P for plasma generation (i.e., the power P supplied to the shower head electrode 16 in the illustrated case) is also not particularly limited, and may be set as appropriate for the required film deposition rate and the like. Therefore, the power may be set as appropriate depending on the flow rate of silane gas so as to fall within the range of the invention.

The frequency of this power is also not particularly limited, and power at various frequencies employed in depositing a silicon nitride layer by CCP-CVD may be applicable.

In the present invention, the film deposition pressure is set to 20 to 200 Pa.

At a film deposition pressure exceeding 200 Pa, a large amount of large-sized particles are formed by a vapor phase reaction during film deposition. Application of a bias potential to the substrate Z cannot prevent the particles from being incorporated into the film, whereby the gas barrier properties and film quality are deteriorated due to incorporation of the particles into the silicon nitride layer.

Conversely, in order for the film deposition pressure to be less than 20 Pa, it is necessary to provide sophisticated vacuum evacuation means and vacuum chamber, thus leading to an increase in device cost. Particularly in cases where the film deposition rate is to be improved to produce gas barrier films with high productivity, a film deposition pressure set to less than 20 Pa will considerably increase the device cost.

In other words, by setting the film deposition pressure to 20 to 200 Pa, the present invention is capable of producing in an inexpensive device, with high productivity, high-quality gas barrier films which exhibit excellent gas barrier properties over a long period of time.

The film deposition pressure is preferably in a range of 40 to 100 Pa from the viewpoint that incorporation of the particles into the silicon nitride layer can be advantageously suppressed while reducing the device cost with advantage.

In the production method of the invention, the silicon nitride layer is deposited while keeping the substrate Z at a temperature of 70° C. or less.

At a substrate Z temperature exceeding 70° C., gas barrier films cannot be produced using the substrate Z made of a less heat-resistant material such as PET film.

The lower limit of the substrate temperature is not particularly limited as long as the substrate has a temperature at which the silicon nitride layer can be deposited in accordance with the film deposition conditions.

In the production method of the invention, a bias potential of −100 V or less is applied to the substrate Z during film deposition. In other words, in the illustrated CVD device 10, the silicon nitride layer is deposited on the substrate Z while adjusting the power (bias power) supplied from the bias power source 24 to the substrate holder 14 in accordance with the film deposition pressure or other conditions so that the substrate holder 14 has a potential of −100 V or less.

The bias potential formed at the substrate Z may have a direct current component (Vdc) of −100 V or less in the case of an RF potential and a minimum potential of −100 V or less in the case of a DC pulsed potential.

In the film deposition by means of CCP-CVD, the bias potential is generally applied to the substrate Z during film deposition for the purpose of making a denser film. In contrast, in the present invention, the bias potential is applied to the substrate Z during film deposition for the purpose of achieving the quite different effect from usual that incorporation of particles into a film is prevented.

As described above, the particles formed by a vapor phase reaction under the film deposition conditions of the invention are negatively charged. Therefore, by forming a bias potential of −100 V or less at the substrate, the particles which are likely to enter the substrate Z (silicon nitride layer during film deposition) repel the substrate Z under the action of the electric charge, thus preventing incorporation of the particles into the silicon nitride layer during film deposition. In the present invention, application of the bias potential considerably minimizes the deterioration of the gas barrier properties due to the particles incorporated into the silicon nitride layer.

At a substrate Z bias potential exceeding −100 V, the effect of preventing the incorporation of the particles into the silicon nitride layer cannot be fully achieved, leading to a decrease in the gas barrier properties of gas barrier films, whereby gas barrier films having desired gas barrier properties cannot be consistently produced.

On the other hand, the lower limit of the bias potential formed at the substrate Z is not particularly limited and should be set as appropriate depending on the main power supplied for plasma generation (power supplied to the shower electrode 16 in the illustrated case). The lower limit is preferably at least −700V.

By setting the lower limit of the bias potential of the substrate Z to at least −700 V, more preferred results can be obtained in that a decrease in the gas barrier properties resulting from ion bombardment on the substrate Z due to a too strong effect of the bias potential (due to a bias potential having a too large absolute value) can be reliably prevented.

The frequency of the RF potential supplied to the substrate holder 14 is not particularly limited and is preferably at least 100 kHz. In cases where the pulsed potential is used for the bias potential of the substrate Z, application of a pulsed potential at a frequency of at least 100 kHz is preferred.

By having such a configuration, the time period for which an effective bias potential is not formed at the substrate Z is shortened to enable the effect of preventing the incorporation of the particles into the silicon nitride layer to be more advantageously achieved.

In terms of achieving this effect more advantageously, the bias potential formed at the substrate Z more preferably has a frequency of at least 400 kHz.

The power for forming the bias potential at the substrate Z (i.e., the power supplied from the bias power source 24) may be set as appropriate depending on the main power for plasma generation.

The CVD device 10 shown in the FIGURE is a so-called batch type device in which a silicon nitride layer is formed on a single substrate Z to produce a gas barrier film. However, the gas barrier film production method of the invention is not limited to this, but a so-called roll to roll type device in which film deposition is carried out while an elongated substrate is transported in its longitudinal direction may also be used more advantageously.

As is well known, the roll to roll device (film deposition device) is a device in which an elongated substrate is fed out from a substrate roll having the substrate wound therearound to be transported to a film deposition chamber, where film deposition is carried out on the substrate being transported in its longitudinal direction, and the substrate having a film deposited thereon is wound again into a roll.

In a batch type device such as the CVD device 10, after the end of film deposition, it is necessary to stop application of the bias potential to the substrate Z, and then take out the substrate Z from the vacuum chamber.

Upon stopping the application of the bias potential to the substrate Z, the effect of preventing the incorporation of particles into the substrate Z is no longer exhibited, which may result in adhesion of particles on the surface of the silicon nitride layer formed and staining of the surface of the substrate Z.

In contrast, with the roll to roll type device, the substrate following film deposition is subsequently discharged from the film deposition chamber (space where film deposition is carried out) to be wound into a roll.

Therefore, even if application of the bias potential to the substrate Z is stopped in the film deposition chamber after the end of film deposition (gas barrier film production), adhesion of particles to the surface of the silicon nitride layer can be prevented. Even if particles adhere to the elongated substrate, adhesion is limited to only part of the substrate such as its trailing edge portion.

In the present invention, known devices may be used for the roll to roll type device without any particular limitation as long as the silicon nitride film can be deposited by means of CCP-CVD.

An illustrative example includes a device which uses a cylindrical drum for transporting a substrate. This device carries out film deposition through CCP-CVD by disposing the drum for transporting the substrate within a film deposition chamber, wrapping the elongated substrate over a predetermined region of the lateral surface of the drum, rotating the drum to transport the substrate in its longitudinal direction, forming an electrode pair with the drum and an electrode disposed so as to face the drum, and supplying a material gas between the drum and the electrode.

In this case, the gas barrier film production method of the invention should be implemented by supplying the main power for plasma generation to the electrode disposed so as to face the drum and supplying the power for forming a bias potential of −100 V or less at the substrate to the drum.

Another device is also preferred in which a pair of electrodes in plate form are disposed in a film deposition chamber so as to face each other, an elongated substrate is transported in its longitudinal direction so as to pass between the electrodes in plate form, and a material gas is supplied between the substrate and the electrode to carry out film deposition by means of CCP-CVD. In this case, for example, the substrate may be transported so that its transport path is closer to one of the electrodes, and the electrode closer to the substrate may be used as the electrode for forming the bias potential at the substrate.

While the method of producing a gas barrier film according to the present invention has been described above in detail, the present invention is by no means limited to the foregoing embodiments and it should be understood that various improvements and modifications may of course be made without departing from the scope and spirit of the invention.

EXAMPLES

Next, the present invention is described in further detail by referring to the Examples.

Example 1

The CVD device 10 shown in the FIGURE was used to deposit a silicon nitride layer with a thickness of 100 nm on the surface of a substrate Z, thus producing a gas barrier film. The substrate Z used was a PET film (Cosmoshine A430 available from Toyobo Co., Ltd.) with a thickness of 100 μm.

The substrate Z was disposed at a predetermined position on the substrate holder 14 and the vacuum chamber 12 was closed. The substrate holder 14 was made of aluminum and had a refrigerant circulating system incorporated therein as the temperature adjusting means.

The temperature adjusting means incorporated in the substrate holder 14 was driven so that the substrate Z had a temperature of 70° C. The temperature adjusting means measured the temperature of the substrate holder 14 to control the temperature of the substrate Z by feedback control so that its temperature was kept at 70° C. The substrate holder 14 was made of aluminum having high heat conductivity and the substrate Z was as thin as 100 μm, so that the temperature of the substrate holder 14 was substantially equal to that of the substrate Z.

After a period of time necessary for stabilizing the temperature of the substrate Z (substrate holder 14) has elapsed, the vacuum evacuation means 28 was driven to evacuate the vacuum chamber 12 and at the point in time when the internal pressure of the vacuum chamber 12 had reached 0.01 Pa, a material gas including silane gas, ammonia gas and nitrogen gas was supplied from the gas supply means 30 to the shower head electrode 16. The silane gas, ammonia gas and nitrogen gas were flowed at flow rates of 50 sccm, 50 sccm and 400 sccm, respectively.

Then, the vacuum evacuation means 28 was used to adjust the evacuation so that the internal pressure of the vacuum chamber 12 (film deposition pressure) reached 40 Pa.

After the internal pressure of the vacuum chamber 12 had stabilized, the RF power source 18 was driven to supply to the shower head electrode 16 a power of 1000 W at a frequency of 13.56 MHz serving as the main power for plasma generation, and the bias power source 24 was driven to form a bias potential at a frequency of 100 kHz at the substrate holder 14, thereby starting deposition of a silicon nitride layer on the surface of the substrate Z. The power supplied from the bias power source 24 to the substrate holder 14 was adjusted so that the substrate holder 14 had a potential of −100 V.

In other words, the ratio P/Q of the power supplied to the shower head electrode 16 to the silane gas flow rate in the present embodiment was 1000 W/50 sccm, that is, 20 W/sccm.

Upon deposition of a silicon nitride layer with a thickness of 100 nm on the surface of the substrate Z, driving of the RF power source 18 and the bias power source 24, supply of the material gas from the gas supply means 30, and driving of the vacuum evacuation means 28 were stopped; then the vacuum chamber 12 was opened to the atmosphere; and the substrate Z having the silicon nitride layer formed thereon was taken out from the vacuum chamber 12.

The film thickness was obtained by using the film deposition rate that had been preliminarily determined by experiment.

Example 2

Example 1 was repeated except that the power supplied from the RF power source 18 to the shower head electrode 16 was changed to 750 W, in other words, the ratio P/Q was changed to 15 W/sccm, thereby producing a gas barrier film.

Example 3

Example 1 was repeated except that the power supplied from the RF power source 18 to the shower head electrode 16 was changed to 1500 W, in other words, the ratio P/Q was changed to 30 W/sccm, thereby producing a gas barrier film.

Example 4

Example 1 was repeated except that the power supplied from the RF power source 18 to the shower head electrode 16 was changed to 750 W, in other words, the ratio P/Q was changed to 15 W/sccm and the film deposition pressure was changed to 200 Pa, thereby producing a gas barrier film.

Example 5

Example 1 was repeated except that the film deposition pressure was changed to 20 Pa, thereby producing a gas barrier film.

Example 6

Example 1 was repeated except that the frequency of the bias potential applied from the bias power source 24 to the substrate holder 14, in other words, the frequency of the bias potential formed at the substrate Z was changed to 50 kHz, thereby producing a gas barrier film.

Comparative Example 1

Example 1 was repeated except that the power supplied from the RF power source 18 to the shower head electrode 16 was changed to 1600 W, in other words, the ratio P/Q was changed to 32 W/sccm, thereby producing a gas barrier film.

Comparative Example 2

Example 1 was repeated except that the power supplied from the RF power source 18 to the shower head electrode 16 was changed to 700 W, in other words, the ratio P/Q was changed to 14 W/sccm, thereby producing a gas barrier film.

Comparative Example 3

Example 2 was repeated except that the substrate temperature was changed to 100° C., thereby producing a gas barrier film.

Comparative Example 4

Example 2 was repeated except that the bias potential applied from the bias power source 24 to the substrate holder 14, in other words, the bias potential formed at the substrate Z was changed to −80 V, thereby producing a gas barrier film.

Comparative Example 5

Example 2 was repeated except that the film deposition pressure was changed to 210 Pa, thereby producing a gas barrier film.

The gas barrier films obtained in Examples 1 to 6 and Comparative Examples 1 to 5 were checked for the gas barrier properties and stability over time and comprehensively evaluated based on the results obtained.

Gas Barrier Properties:

The water vapor transmission rate (WVTR) [g/m$^2$·day] was measured using a water vapor transmission rate instrument AQUATRAN available from MOCON, Inc.

Stability Over Time:

Each gas barrier film was subjected to elemental analysis of the composition using ESCA3200 manufactured by Shimadzu Corporation.

Then, each gas barrier film was allowed to stand for 500 hours in an environment of a temperature of 85° C. and a relative humidity of 85% (in a high temperature and high humidity environment) and was subjected to elemental analysis in the same manner. The gas barrier film was rated as "good" when the composition of the silicon nitride layer did not changed after it had been allowed to stand in a high temperature and high humidity environment, and rated as "poor" when the composition changed due to oxidation or other factor.

Comprehensive Evaluation:

The gas barrier film was rated as "excellent" when the water vapor transmission rate was at most 0.01 g/m$^2$·day and the stability over time was good.

The gas barrier film was rated as "good" when the water vapor transmission rate was more than 0.01 g/m$^2$·day but less than g/m$^2$·day and the stability over time was good.

The gas barrier film was rated as "poor" when at least one of the following parameters applied: the water vapor transmission rate was at least 0.02 g/m$^2$·day and the stability over time was poor.

The film deposition conditions and evaluation results are shown in Table 1 below.

As shown in Table 1, the gas barrier films produced by the production method of the invention are high-quality gas barrier films having excellent gas barrier properties (WVTR) and stability over time. The gas barrier film in Example 6 in which the frequency of the bias potential formed at the substrate Z was 50 kHz is deemed to have a larger amount of particles incorporated into the silicon nitrate layer than in other examples and is hence somewhat inferior in gas barrier properties to other examples but there is no practical problem in many applications.

In contrast, in Comparative Example 1 in which P/Q was too large, that is, the power for plasma generation was too large, a large amount of particles were formed, and incorporation of the thus formed particles into the silicon nitride layer could not be fully suppressed even with a bias potential formed at the substrate Z, thus deteriorating the gas barrier properties. In Comparative Example 2 in which P/Q was too small, that is, the power for plasma generation was too small, the initial gas barrier properties were good but the silicon nitride layer changed over time, and the gas barrier properties were deemed to drastically deteriorate over time.

In Comparative Example 3 in which the substrate temperature was set to 100° C., the gas barrier properties and the change over time could not be determined due to deformation of the substrate Z.

In Comparative Example 4 in which the substrate Z had a bias potential as too high as −80 V, incorporation of the particles into the silicon nitride layer could not be fully suppressed, thus deteriorating the gas barrier properties. In addition, in Comparative Example 5 in which the film deposition pressure was too high, a large amount of large-sized particles were formed and incorporation of such particles into the silicon nitride layer could not be fully suppressed even with a bias potential formed at the substrate Z, thus deteriorating the gas barrier properties.

The above results clearly show the beneficial effects of the present invention.

What is claimed is:

1. A method of producing a gas barrier film comprising the steps of:
   supplying a material gas including silane gas, ammonia gas and at least one of nitrogen gas and hydrogen gas to a process chamber;
   keeping the process chamber at an internal pressure of 20 to 200 Pa;

TABLE 1

| | Film deposition condition | | | | | Evaluation result | | |
|---|---|---|---|---|---|---|---|---|
| | RF power (W) | Bias potential (V) | P/Q (W/sccm) | Substrate temperature (° C.) | Film deposition pressure (Pa) | Bias frequency (kHz) | WVTR (g/m$^2$·day) | Change over time | Comprehensive evaluation |
| EX 1 | 1000 | −100 | 20 | 70 | 40 | 100 | 0.003 | Good | Excellent |
| EX 2 | 750 | −100 | 15 | 70 | 40 | 100 | 0.004 | Good | Excellent |
| EX 3 | 1500 | −100 | 30 | 70 | 40 | 100 | 0.006 | Good | Excellent |
| EX 4 | 750 | −100 | 15 | 70 | 200 | 100 | 0.008 | Good | Excellent |
| EX 5 | 1000 | −100 | 20 | 70 | 20 | 100 | 0.003 | Good | Excellent |
| EX 6 | 1000 | −100 | 20 | 70 | 40 | 50 | 0.012 | Good | Good |
| CE 1 | 1600 | −100 | 32 | 70 | 40 | 100 | 0.13 | Good | Poor |
| CE 2 | 700 | −100 | 14 | 70 | 40 | 100 | 0.007 | Poor | Poor |
| CE 3 | 750 | −100 | 15 | 100 | 40 | 100 | unmeasurable | unmeasurable | Poor |
| CE 4 | 750 | −80 | 15 | 70 | 40 | 100 | 0.12 | Good | Poor |
| CE 5 | 750 | −100 | 15 | 70 | 210 | 100 | 0.15 | Good | Poor | holding a substrate in the process chamber at a substrate temperature of not more than 70° C.;

forming a bias potential of −100 V or less at the substrate; and supplying power P (W) to the material gas so as to have a ratio P/Q of the power P to a silane gas flow rate Q (sccm) of 15 to 30 W/sccm to generate plasma, thereby depositing a silicon nitride layer on a surface of the substrate.

2. The method according to claim 1, wherein the bias potential formed at the substrate is an RF potential at a frequency of at least 100 kHz.

3. The method according to claim 1, wherein the substrate is held in the process chamber through a substrate holder and the bias potential is applied to the substrate through the substrate holder.

4. The method according to claim 1, wherein the silicon nitride layer is formed on the surface of the substrate with the substrate at rest in the process chamber.

5. The method according to claim 1, wherein the silicon nitride layer is formed on the surface of the substrate as the substrate is transported in the process chamber.

6. The method according to claim 1, wherein the material gas is supplied into the process chamber through a shower head electrode disposed so as to face the substrate within the process chamber and the power for plasma generation is applied to the material gas through the shower head electrode.

* * * * *